United States Patent [19]

Shizukuishi et al.

[11] Patent Number: 4,841,348
[45] Date of Patent: Jun. 20, 1989

[54] SOLID STATE IMAGE PICKUP DEVICE

[75] Inventors: Makoto Shizukuishi; Ryuji Kondo, both of Kanagawa, Japan

[73] Assignee: Fuji Photo Film Co., Ltd., Kanagawa, Japan

[21] Appl. No.: 71,684

[22] Filed: Jul. 9, 1987

[30] Foreign Application Priority Data

Jul. 9, 1986 [JP] Japan .................. 61-159543

[51] Int. Cl.⁴ .......................................... H01L 27/14
[52] U.S. Cl. ........................ 357/30; 357/24; 357/41; 357/42; 357/31; 357/32; 357/40
[58] Field of Search .............. 357/30 H, 30 G, 30 D, 357/31, 32, 24 L R, 40, 41, 42, 30 K, 30 L

[56] References Cited

U.S. PATENT DOCUMENTS

| | | | |
|---|---|---|---|
| 4,271,420 | 6/1981 | Chikamura | 357/24 L R X |
| 4,286,278 | 8/1981 | Lorenze, Jr. et al. | 357/24 L R X |
| 4,322,753 | 3/1982 | Ishihara | 357/24 L R X |
| 4,336,556 | 6/1982 | Sekine et al. | 357/24 L R X |
| 4,499,590 | 2/1985 | Bluzer | 357/24 L R X |
| 4,665,325 | 5/1987 | Yamada et al. | 357/24 L R X |
| 4,665,422 | 5/1987 | Hirao et al. | 357/30 P |
| 4,714,950 | 12/1987 | Kawajiri et al. | 357/24 L R X |

FOREIGN PATENT DOCUMENTS

| | | | |
|---|---|---|---|
| 0040076 | 11/1981 | European Pat. Off. | 357/30 K |
| 1964632 | 7/1970 | Fed. Rep. of Germany | 357/30 G |
| 0583273 | 1/1983 | Japan | 357/30 K |

*Primary Examiner*—Andrew J. James
*Assistant Examiner*—William A. Mintel
*Attorney, Agent, or Firm*—Sughrue, Mion, Zinn, Macpeak, and Seas

[57] ABSTRACT

An solid state optical pickup device having integrally formed therein both a photosensitive matrix and peripheral circuits thereto. Both the photosensitive matrix and the peripheral circuit are built according to CMOS IC technology. A photoconductive film overlies the entire photosensitive matrix and is electrically connected to each of the charge accumulating regions in the matrix.

11 Claims, 2 Drawing Sheets

SOLID STATE IMAGE PICKUP DEVICE

BACKGROUND OF THE INVENTION

1. Field of the Invention

The present invention relates to a solid state pickup device, and more particularly, to a solid state pickup device implemented as a complementary MOS IC.

2. Background of the Invention

Heretofore, various kinds of solid state pickup devices have employed charge coupled elements (referred to herein as a CCD solid state pickup device) or have employed MOS solid state pickup devices. Both of these types of devices are often designed in conformity with the manufacturing process of n-channel MOS (nMOS) ICs.

The reason for this (i.e. use of nMOS ICs) is attributed to the effective utilization in the art of designing nMOS ICs, which has made a marked progress for designing picture elements of high resolution and sensitivity with relative simplicity.

In the conventional solid state pickup device, however, a photosensitive section where photoelectric conversion elements, such as photo diodes constituting picture elements are disposed are integrally formed in one and the same chip with horizontal and vertical scanning shift registers for reading out a video signal produced in each photoelectric conversion element. Nonetheless, it is still difficult to form, integrally with the photosensitive region, a peripheral circuit, especially, an oscillation circuit for generating clock signals applied to the shift registers, and a processing circuit for performing a correction process based on the video signals thus read out and for color signal isolation.

The reason for the difficulty is that parameters for optimizing the photoelectric conversion characteristics of the photoelectric conversion element being produced, e.g., the impurity concentration of the semiconductor substrate and the depth of the p-n junction of the photoelectric conversion element, are incompatible with the formation of a logic circuit offering superior characteristics. That is, even though improvements in the photoelectric conversion characteristics are attempted, the use of the aforesaid manufacturing parameters for designing a peripheral circuit will result in a low noise margin or a high rate of power consumption.

In consequence, a solid state pickup device equipped with a photosensitive region and a peripheral circuit must be built with different manufacturing parameters as an individual IC device and then wired together on an electric circuit board. However, the above described process of manufacturing solid state pickup devices has caused an obstruction to the miniaturization of electric devices in cameras and so forth.

Moreover, solid state pickup devices equipped with photosensitive sections are manufactured according to the process of designing nMOS ICs, whereas use is often made of complementary MOS (CMOS) ICs capable of providing a wide range of operating voltages with a small power consumption and a high noise margin for the manufacture of peripheral circuits. As a result, the solid state pickup devices and the peripheral circuits require mutual matching.

Therefore, there has been proposed a solid state pickup device whose photosensitive region and peripheral circuit are integrally formed on the same semiconductor chip as a CMOS IC. However, the conventional solid state pickup device as a CMOS IC presents the following problems.

As set forth above, the quality of photoelectric conversion characteristics is dependent on manufacturing parameters including the impurity concentration of the semiconductor substrate and the depth of the p-n junction of the photoelectric conversion element such as a photodiode for use in forming a picture element. Even though he solid state pickup device is made consistent with a CMOS IC, the impurity concentration of the semiconductor substrate should be lower by about an order a magnitude than what is employed in the conventional art of designing CMOS ICs in order to obtain optimum photoelectric conversion characteristics. As is well known, the impurity concentration of the semiconductor substrate is set high to prevent a latch-up phenomenon due to parasitic thyristor current paths. However, if an improvement in photoelectric conversion characteristics is attempted as mentioned above, the latch-up phenomenon will readily occur and will cause internal elements to be damaged.

In addition, the depth of the p-n junction of the photoelectric conversion element is set small than that in the case of the conventional CMOS IC in consideration of color sensitivity, e.g., sensitivity to blue color. Accordingly, the junction depth is unfit for designing the peripheral circuit.

As set forth above, since the manufacturing parameters fit for determining the photoelectric conversion characteristics and the peripheral circuits are related oppositely to each other, it has hardly been possible to manufacture solid state pickup devices offering good quality characteristic as a CMOS IC.

SUMMARY OF THE INVENTION

The present invention is intended to solve the aforesaid problems and it is therefore an object of the invention to provide a solid state pickup device capable of being integrally formed with a photosensitive region and a peripheral circuit in the same CMOS IC semiconductor chip (including what is used for designing a conventional CMOS logic circuit) based on suitable manufacturing parameters.

In order to accomplish the aforesaid object, the present invention uses a CMOS IC manufacturing process to provide a solid state pickup device, comprising a photosensitive section having a plurality of charge accumulation regions respectively corresponding to picture elements, transfer means for transferring the signals accumulated in the charge accumulation regions therefrom, and a peripheral circuit integrally formed with the photosensitive section on one and the same semiconductor substrate. A photoelectric conversion element is allowed to be formed within the semiconductor substrate not otherwise performing photoelectric conversion as in the conventional case, by forming a photoconductive film electrically coupled to each charge accumulation region on the surface of the photosensitive region and making each charge accumulation means receive a video signal resulting from the photoelectric converting action of the photoelectric film. As a result, the integration of the photosensitive region and the peripheral circuit is made possible through the art of designing CMOS ICs.

DETAILED DESCRIPTION OF THE INVENTION

Figure 1:
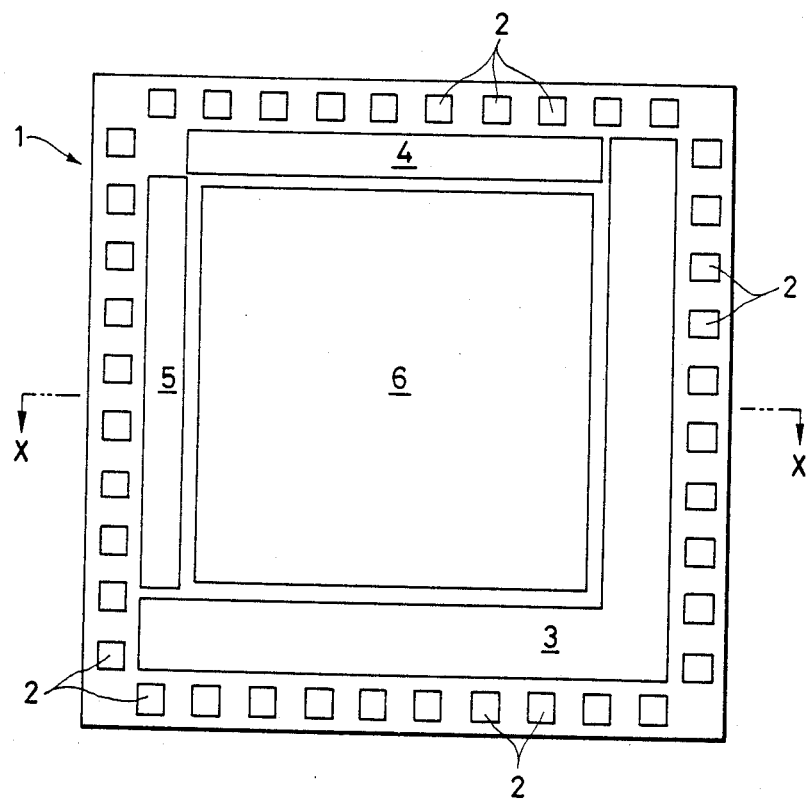
FIG. 1 is a block diagram showing an arrangement of corresponding circuits in a solid state pickup device embodying the present invention.

Referring to the accompanying drawings, a solid state pickup device embodying the present invention will be described. FIG. 1 is a block diagram showing an arrangement of corresponding circuits formed on a semiconductor chip, whereas FIG. 2 is a schematic structural sectional diagram taken on line X—X of FIG. 1.

There are formed a plurality of bonding pads 2 at the peripheral sides of a semiconductor chip 1. Inside the area within the bonding pads 2, there is a peripheral circuit 3, a horizontal scanning shift register 4, and a vertical scanning shift register 5. Further, in the center of the semiconductor chip 1, there is a photosensitive section 6 having a plurality of picture elements.

Figure 2:
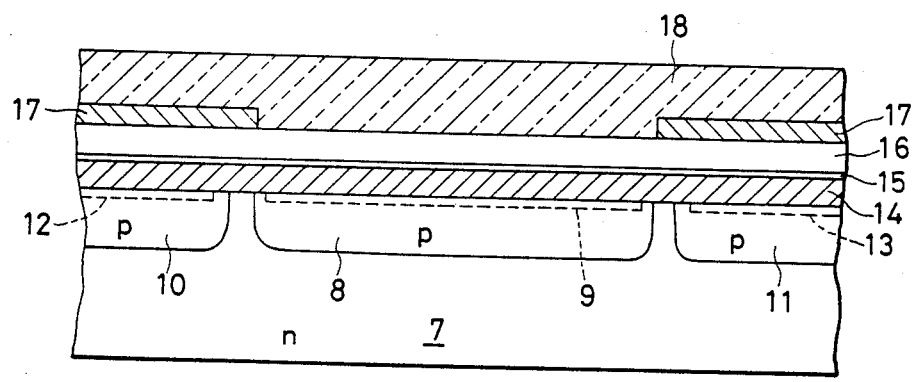
FIG. 2 is a schematic structural sectional block diagram taken on line X—of FIG. 1.

As shown in FIG. 2, picture elements made of n-channel matrix-like MOS transistors are formed on a surface portion 9 of a p-type diffusion layer (P-well) 8 formed in an n-type semiconductor substrate 7. The lateral range of the p-type diffusion layer 8 corresponds to the photosensitive section 6.

P-type diffusion layers 10 and 11 form the horizontal and vertical scanning shift registers 4 and 5 and a logic circuit of the peripheral circuit 3. The p-type diffusion layers 10 and 11 are formed around the p-type diffusion layer 8, but are separated from it. More specifically, the n-channel MOS transistors for the complementary CMOS transistors are formed on a surface partition 12 and 13 of the outer P-type diffusion layers 10 and 11, respectively, and the other p-channel MOS transistors are formed in appropriate portions of the n-type semiconductor substrate 7.

As shown in FIG. 2, the chip 1 includes a photoconductive film 14 made of amorphous silicon, a transparent electrode layer 15, a color filter 16, a shading layer 17 formed of an aluminum film and a transparent glass layer 18 which are laminated on the n-type semiconductor substrate 7 and the p-type diffusion layers 9, 10 and 11 in the order shown in FIG. 2. The shading layer 17 is provided to prevent light from being incident on the peripheral circuits 3, 4 and 5 other than the photosensitive section 6.

Figure 3:
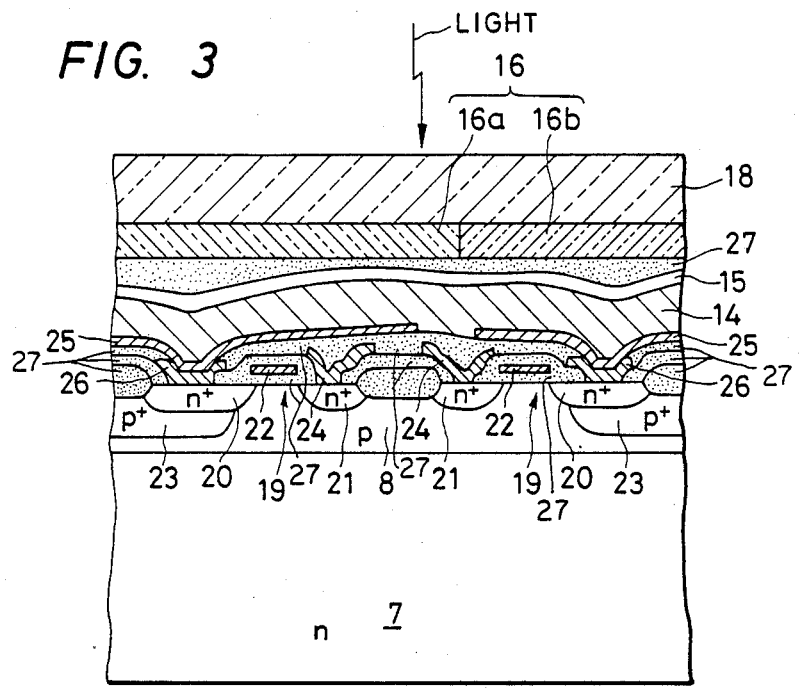
FIG. 3 is an enlarged structural sectional diagram of the principal part of the sectional view of FIG. 2.

Referring to FIG. 3, the sectional structure of the photosensitive section 6 will subsequently be described in detail, wherein like reference characters designate like parts of FIG. 2. N-channel MOS transistors 19 respectively corresponding to picture elements are formed on the surface portion of the p-type diffusion layer (P-well) 8 which is formed on the n-type semiconductor substrate 7. Specifically, a pair of n+-type regions 20 and 21 for each picture element are disposed on either side of a gate electrode 22 forming a channel between the n+-type regions 20 and 21. Furthermore, a p+-type region 23 is provided below and to the side of the n+-type regions 20 to form an accumulation diode. The n+-type region 20 is equivalent to a source for storing a video signal as described later, and the other n+-type region 21 is equivalent to a drain on the output side, each sending out the video signal from the photosensitive section 6 through a signal read out line 24 connected to the n+-type region 21. Each of the gate electrodes 22 is connected to each output terminal of the horizontal shift register 4.

The n+-type region 20 has a fixed area on a picture element basis. An aluminum metal electrode film 25 isolated from an adjacent one is connected to that n+-type region 20 through a conductive terminal 26.

The photoconductive film 14 of amorphous silicon or the like is provided on the of the metal electrode film 25. The transparent electrode layer 15, a resin 27, the color filter 16 and the glass layer 18 are laminated over the photoconductive film 14.

A three primary color or complementary color mosaic filter is used for the color filter 16 and, for differing color pixels 16a and 16b, substantially the same area is formed so that they can match the metal electrode film 25.

In the solid state pickup device thus constructed, elements having characteristics of good quality are formed for the peripheral circuit 3, and for the horizontal and vertical scanning shift registers 4 and 5. This quality is attainable because manufacturing parameters are applied based on the ordinary art of CMOS ICs for use in designing the so-called CMOS logic circuit. Moreover, the manufacturing parameters are needless to say applied to the n-channel MOS transistor 19 corresponding to the picture element of the photosensitive region 6.

The operation of the solid state pickup device will subsequently be described.

Light derived from an object is incident on the photoconductive film 14 through the glass layer 18, the color filter 16, the resin layer 27 and the transparent electrode 15. The resultant photo current corresponding to each color of the color filter 16 is generated and caused to flow into the n+-type region 20 of a particular n-channel MOS transistor through the metal electrode film 25 and the conductive terminal 26.

The signal corresponding to each picture element of the n+-type region 20 is sent by the scanning signal of the horizontal scanning shift register through the channel formed under the gate electrode 22 to the other n+-type region 21 before being transferred by the signal readout line 24 to the peripheral circuit 3.

Since photoelectric conversion is thus conducted by the photoconductive film 14 provided in the photosensitive section in this embodiment, no large current is allowed to flow into the semiconductor substrate even though light having high intensity of illumination is incident thereon. Therefore, latch-up can be prevented. Moreover, because the MOS transistor corresponding to the picture element formed in the photosensitive section performs no photoelectric conversion, it is necessary to match the depth of the p-n junction with color sensitivity. Therefore, the solid state pickup device can be designed according to CMOS IC technology based on the ordinary manufacturing parameters. In addition, because the photoconductive film has characteristics of excellent color sensitivity, good color sensitivity is available. The light-shielding or shading layer 17 (FIG. 2) formed in the portion other than the photosensitive region prevents the peripheral circuit from malfunctioning because of the incident light from the outside and checks the production of the latch-up phenomenon.

Figure 4:
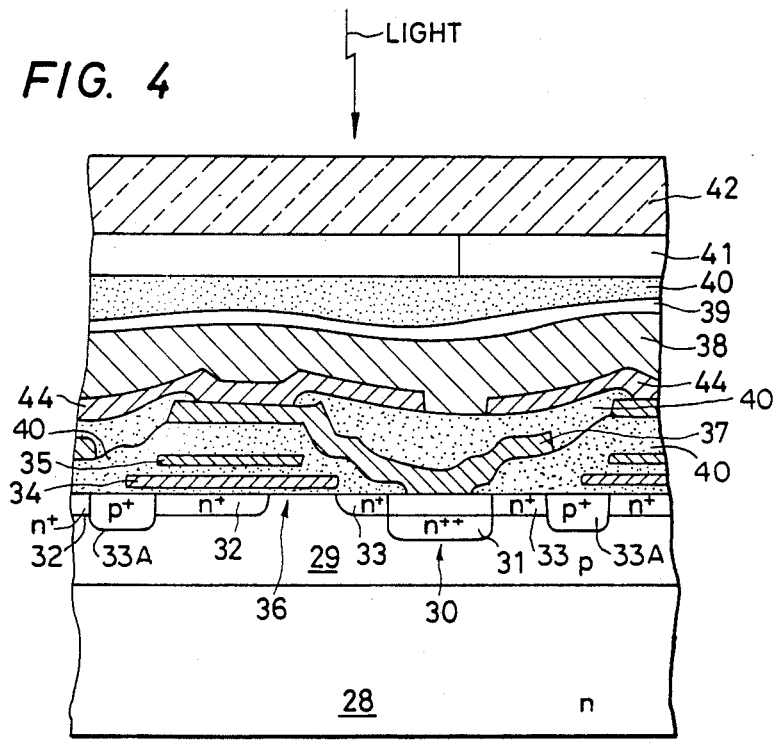
FIG. 4 is an enlarged structural sectional diagram of the principal part of another photosensitive region embodying the present invention.

Referring to FIG. 4, another embodiment of the present invention will be described. In this case, a charge coupled element (CCD) is formed according to the technology of CMOS ICs.

More specifically, there is formed an n++-type region 31 which forms an accumulation diode 30 corresponding to each picture element. The n++-type region 31 is formed on the surface portion of a p-type diffusion layer (P-well) 29 provided on an n-type semiconductor substrate 28. An n+-type region 32 constitutes a vertical CCD for performing charge transfer. A transfer gate 36 is formed with transfer gate electrodes 34 and 35 provided between an n+-type region 33 coupled to the n++-type region 31 and the n+-type region 32. Furthermore, a p+-type region 33A is formed outside the n+-type region 32 and the n++-type region 31 as a stopper for preventing the charge from leaking across the adjacent picture element.

The accumulation diode 30 has a fixed area for each picture element. An aluminum metal electrode film 44 separated between adjacent ones of the picture elements is connected through a conductive terminal 37 to the diode 30. A photoconductive film 38, a transparent electrode layer 39, a resin layer 40, a color filter 41 and a transparent glass layer 42 are laminated on the metal electrode film 36 in the stated order.

The color filter 41 is a mosaic filter or the like and each color pixel has substantially the same area so as to mutually match with the metal electrode film 44.

The operation of the solid state pickup device thus constructed will subsequently be described.

Incident light originating from an object is converted by the photoconductive film 38 into current and caused to flow through the conductive terminal 37 into the accumulation diode 30. The signal stored in the accumulation diode 30 is passed through the transfer channel formed according to the transfer clock signal applied to the transfer gate electrodes 34 and 35 and is transferred to the n+-type region 32 on the CCD shift register side before being sent out from the photosensitive section. In this embodiment, the peripheral circuit formed as a CMOS IC is integrally provided in addition to the photosensitive section.

Although the n-type semiconductor substrate was employed in the aforesaid two embodiments, the present invention is, needless to say, applicable to the use of a p-type semiconductor substrate.

As set forth above, the photoconductive film is made to assume the role of performing photoelectric conversion in the photosensitive section in the solid state pickup device according to the present invention. The signal corresponding to each picture element produced in the photoconductive film is read by the readout means such as the MOS transistor and the CCD shift registers designed as a CMOS IC. Accordingly, it becomes possible to provide a signal chip solid state pickup device with the photosensitive region and the peripheral circuit integrally formed thereon while preventing latch-up and preventing a reduction in the photoelectric conversion characteristics through the art of designing CMOS ICs based on appropriate manufacturing parameters.

Moreover, the integral formation of the photosensitive section and the peripheral circuits thus made possible improves the matching of circuits. Thus their characteristics can be upgraded. By making the most of the advantages of CMOS IC technology, a power-saving, high-noise margin solid state pickup device can also be offered.

What is claimed is:

1. A solid state pickup device, comprising:
   a semiconductor substrate of a first conductivity type;
   a photosensitive section comprising:
      a region of a second conductivity type formed in said semiconductor substrate, said region having semiconductive channels of the first conductivity type located at a surface of said region, and having a plurality of charge accumulation means corresponding to respective picture elements;
   means for transferring signals accumulated in said charge accumulation means;
   a logic circuit integrally formed with said region in said substrate and at a periphery of said region; and
   a photoconductive film formed on, and contiguous with, said substrate including said region and said logic circuit, and means for electrically coupling said photoconductive film to each of said plurality of charge accumulation means, and for supplying thereto an electric signal produced in response to light incident on said photoconductive film.

2. The device according to claim 1, further comprising a transparent electrode layer formed on, and contiguous with, said photoconductive film.

3. The device according to claim 2, further comprising a color filter layer formed on, and contiguous with, said transparent electrode layer.

4. The device according to claim 3, further comprising a light shielding layer formed on, and contiguous with, said color filter layer such that portions of said photoconductive film other than the portion of said photoconductive film directly above said region, are optically shielded.

5. The device according to claim 4, further comprising a glass layer formed on, and contiguous with, said light shielding layer and said color filter layer.

6. The device according to claim 1, wherein the first conductivity is of n-type, the second conductivity is of p-type and wherein said charge accumulation means is an n-channel MOS transistor.

7. The device according to claim 1, wherein said charge accumulation means comprises an accumulation diode.

8. The device according to claim 1, wherein said transfer means comprises a charge-coupled-device (CCD).

9. The device according to claim 1, wherein said region includes a plurality of sources and drains, said sources and drains both being of the first conductivity type, and a plurality of gate electrodes, each of said gate electrodes forming conduction channels between respective pairs of sources and drains.

10. The device according to claim 9, wherein said region includes an accumulation diode of the second conductivity type 11. The device according to claim 9, wherein said semiconductor substrate includes a horizontal shift register and a vertical shift register, and wherein each of said gate electrodes is connected to said horizontal shift register.

* * * * *